United States Patent [19]

Conlon et al.

[11] 3,972,463

[45] Aug. 3, 1976

[54] WIRE PLACEMENT FIXTURE

[75] Inventors: Edward James Conlon, Trenton; Ralph DeStephanis, Middlesex; Thomas Tipton Hitch, Trenton, all of N.J.

[73] Assignee: RCA Corporation, New York, N.Y.

[22] Filed: Feb. 7, 1975

[21] Appl. No.: 548,009

[52] U.S. Cl. .......................... 228/44.1 A; 29/203 J; 29/203 P; 73/88 B; 219/85 G; 228/179
[51] Int. Cl.² ......................................... B23K 19/00
[58] Field of Search ............ 269/43; 219/85 G, 158; 29/203 P, 203 J; 73/88 B; 228/441, 103, 179, 180

[56] References Cited
UNITED STATES PATENTS

| | | | |
|---|---|---|---|
| 1,363,933 | 12/1920 | Trimble | 219/158 |
| 1,456,506 | 5/1923 | Leveridge | 29/203 J |
| 2,755,760 | 7/1956 | Fermanian et al. | 29/203 J |
| 2,835,962 | 5/1958 | Tally et al. | 29/203 P |
| 2,921,550 | 1/1960 | Goodykoontz et al. | 29/203 J |
| 3,634,930 | 1/1972 | Cranston | 73/88 B |
| 3,855,850 | 12/1974 | Norskog | 73/88 B |
| 3,859,715 | 1/1975 | Duffek et al. | 29/203 P |

*Primary Examiner*—Richard E. Aegerter
*Assistant Examiner*—John W. Shepperd
*Attorney, Agent, or Firm*—H. Christoffersen; R. P. Williams; W. L. Muckelroy

[57] ABSTRACT

A microcircuit adhesion testing method and fixture for uniform placement and soldering of a preselected length of wire above a film pad on a microcircuit substrate with consistent substrate-to-wire spacing, comprising a holder for the substrate, finger spacers attached to the holder, and a member for pressing the wire against the spacers. The spacers are made of a material which is not wettable with solder of the type used to attach the wire to the film.

3 Claims, 2 Drawing Figures

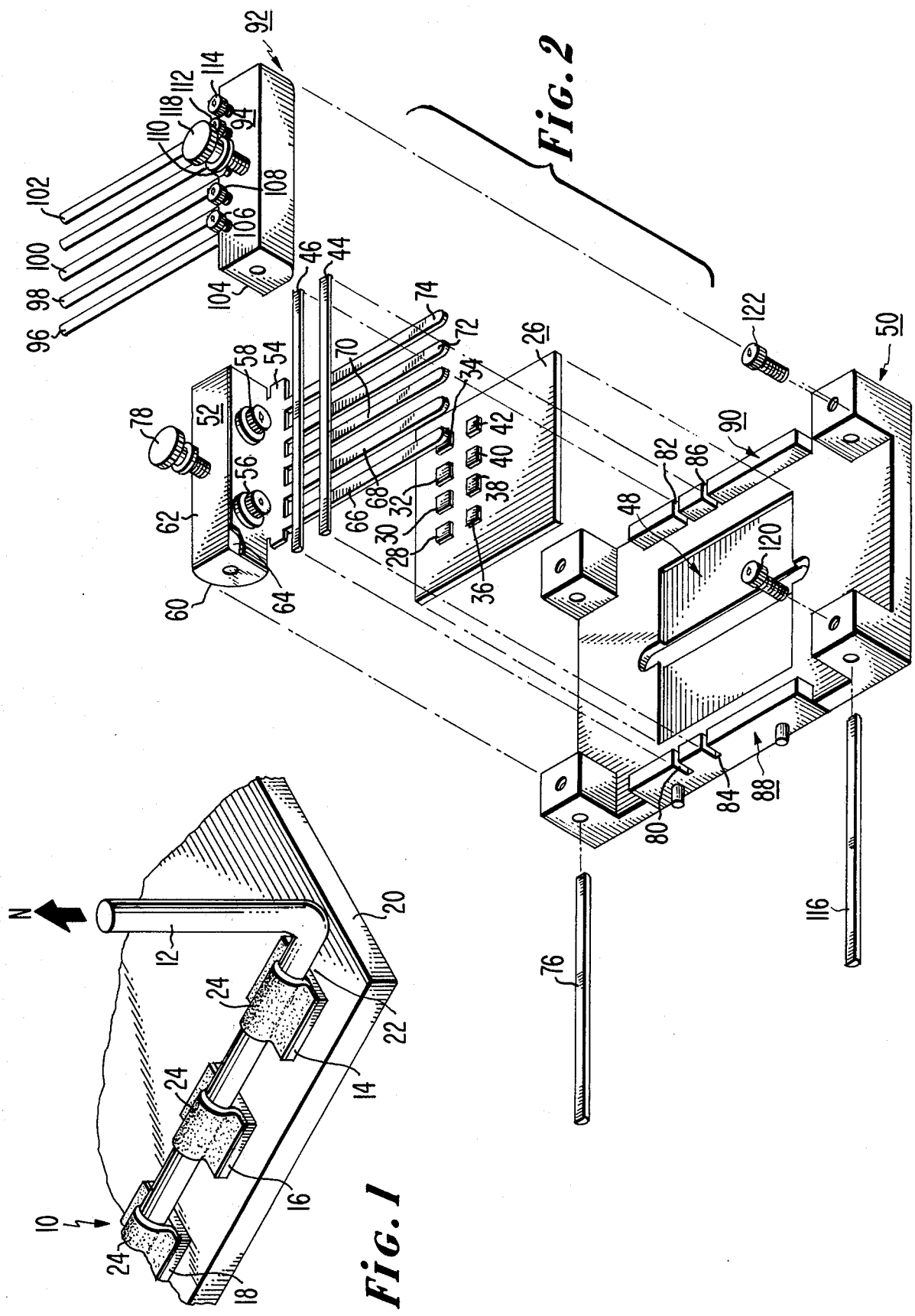

WIRE PLACEMENT FIXTURE

The invention disclosed herein is generally related to a method and apparatus for making adhesion strength tests of films deposited on microcircuit substrates. The invention is specifically related to an apparatus that will provide a uniform and reproducible spacing between a wire and a film pad deposited on a substrate. The inventors have determined that unifrom and reproducible substrate-to-wire spacing insures accurate determination of the adhesion strengths of tested films.

The adhesion strength test is generally referred to as a soldered wire tensile-peel adhesion strength test and it is conducted by first depositing test specimens of films onto a substrate. Next, a length of wire is soldered to each of the pads and the end of the wire to which a pull force is to be applied is bent orthogonal to a principal surface of the substrate, the principal surface being adjacent the pad. An increasing pull force is applied at a constant strain rate of 1.3 cm per minute to the wire and the force at which the pad is released from the substrate is recorded as the tensile-peel strength of the film pad.

A problem with the above method has been an inconsistency in the data obtained. The inventors have ascertained that a parameter which has contributed to the inconsistency is the spacing between the wire and the substrate pad. A usual practice has been for a technician to either reflow pretinned pads to join the wire to the substrate or reflow preforms of solder placed between the wire and the pad. This has resulted in significant variations in the wire-to-substrate spacings and as a consequence, anomalous data from tensile-peel strength tests.

The present novel apparatus provides a means for applying test wire to a substrate with positive mechanical control of the wire-substrate spacing. It also includes a means by which several controlled connections of several wires may be made to a plurality of pads on a substrate.

The apparatus is illustrated in the drawing of which:

FIG. 1 is an illustration of a soldered-wire tensile-peel strength test substrate; and FIG. 2 is an exploded view showing the present apparatus.

This application deals with a mechanical tool for adhesively joining at least one of several points on a wire to a corresponding film pad on a microcircuit substrate with a predetermined and consistent substrate-to-wire spacing from substrate-to-substrate and from point-to-point. However, to provide a clear understanding of where in the art of testing the adhesion strength of microcircuit films the present invention fits, the problem solved by the invention, and the reason for the use of the apparatus, the method in which the apparatus is used will be discussed first.

The soldered-wire tensile-peel test of interest in this application is particularly directed to the quantitative measurement of the adhesion strength of thick-films and thin-films. The quantitative measurement test is used to measure variations in adhesion caused by changes in substrates or film materials or by changes in processing.

Aside from the fixturing necessary to hold the substrate to implement an adhesion test, a device (not shown), which is connected at one end to a rigid frame (not shown) and connected on the other end to the wire of the test specimen, is used for measurement of tensile force. The substrate of the test specimen is connected to a rigid beam (not shown) that is driven along the frame until the specimen is loaded to a stress level sufficient to cause failure. The test is illustrated generally in FIG. 1 wherein the specimen 10 with wire 12 attached to pads 14, 16, and 18 on a substrate 20 by means of solder 24 is under test. The wire 12 has a preselected length parallel to the substrate 20 with preselected points in the preselected length parallel to the substrate and located a predetermined distance above the pads 14, 16, and 18. An increasing force $\overline{N}$ is exerted along the orthogonal portion of wire 12 connected to pad 14 to determine the stress level at which pad 14 fails. It is common practice after the testing of pad 14 to successively rebend the wire 12 orthogonal to the pads 16 and 18 as shown in the drawing for pad 14.

Variations in wire size, wire hardness, pad dimensions, the type and amount of solder, age of the solder assembly prior to testing, and the geometry and stresses produced by bending the pull wire orthogonal to the substrate are all known to affect the test results. The present inventors have invented a means for positioning the wire with respect to the film pad surface, which means provides uniform test data (all of the other above mentioned factors being quantitatively fixed).

The present novel invention may be understood and analyzed by use of a few assumptions and some intuition. Assume that failure is initiated in the film-to-substrate interface and immediately causes a complete delamination of the pad. Assume further that the adhesion strength of the pad is uniform, and that aging has allowed any stresses from fabrication of the test part to be dissipated. Failure should then begin at the point where a maximum lifting stress is applied to the film. In FIG. 1, this occurs at, or very near the point where the underside 22 of the wire 12 is first joined by the solder 24 to the film pad 14. Because of the thinness of the film pad 14 with respect to the diameter of the wire 12 and the length and width of the pad 14, this maximum lifting stress should transfer a maximum separating stress to the film-to-substrate interface below. Hence, on the further assumption that the solder has a low yield strength with respect to the wire and that the solder plastically flows during the test, it may be concluded that the distribution of forces, and consequently, the maximum load which can be borne by a cross-sectional portion of the film pad will be a function of the separation, within the solder, between the wire and the pad.

To illustrate this discovery consider two examples. First, if the wire lies very close to the pad, i.e., 25 micrometers or less, the local stress applied to the film for a given pull force applied through the wire will be relatively high under the wire. The stress from the pull force will be even higher immediately under the center of the wire because that area becomes stressed in triaxial tension. Triaxial tension is present because of the applied stress force $\overline{N}$ and because the geometry of the assembly prevents any significant plastic accommodation by the flow of solder from the fillet areas (those areas on each side of the wire) into the area under the center of the wire.

In the second example, the wire is spaced off the pad by solder, for example, 250 micrometers. The larger wire-to-substrate spacing allows the solder to plastically accommodate some of the strain in the solder under the wire, and causes a substantially improved distribution of the stress across the pad. Thus, for the same load as was applied by the wire in the first example, a lower peak stress will develop in the film pad. The apparatus of the invention, shown in FIG. 2, is designed to take advantage of the benefits of the test structure in the second example. Moreover, the apparatus eliminates variations between samples and thus reduces the anomalous scatter of data from tests.

Shown in FIG. 2 is an exploded view of the apparatus in which a substrate 26 having film pads thereon, such as pads 28, 30, 32, 34, 36, 38, 40, and 42, is held and wires 44 and 46 are positioned for soldering to these pads. The substrate 26 is placed in a rectangular recess 48 in a holding means 50. Once the substrate 26 is in place it is held down by a spacing means comprised of a mounting member 52 and a spacing means finger member 54 demountably attached to the mounting member 52 by means of screws 56 and 58. The mounting member 52 is fashioned from a right cylindrical rod and is in fact a quartered section of such a rod, the section being taken in the direction of the principal axis of the rod. The mounting member 52 thus has a cylindrically curved surface 60 bounded lengthwise by two rectangular surfaces 62 and 64. The spacing means finger member 54 is adjacent to the surface 64 with the fingers 66, 68, 70, 72, and 74 bent perpendicular to the surface 64. A pivot rod 76 extends through a hole in the body of the mounting member 52 as well as through holes in raised corners of the holding means 50. The rod 76 is held in place in the mounting member 52 with a set screws 78 located in the mounting member 52 and the entire spacing means assembly pivots freely with the rod 76.

The fingers 66, 68, 70, 72, and 74 lie flat against the substrate 26 inbetween rows of pads. The fingers are made of a metal not wettable by the solder and flux combinations utilized for soldering the wire to the pads. The fingers are preferably flat lengths of chrome-plated beryllium copper or of molybdenum. As the spacing means, mounting member 52 is pivoted toward the substrate 26 so also are the fingers 66, 68, 70, 72, and 74 pivoted against it. The thickness of the fingers 66, 68, 70, 72, and 74 is uniform and may have any value from 125 micrometers up to 500 micrometers. The predetermined distance above the pads for the preselected points is determined by the thickness of the spacing means fingers 66, 68, 70, 72, and 74 when measured along a line orthogonal to the substrate surface, the spacing means fingers being parallel to the surface of the substrate 26.

The substrate 26 is oriented such that pads 28, 30, 32, and 34 are centered underneath wire 46 and pads 36, 38, 40, and 42 are centered underneath wire 44. Wire 46 is fitted into and held by troughs 80 and 82 formed in raised portions 88 and 90 of the holding means 50. The wire 44 is fitted into and held by similar troughs 84 and 86. Both wire 44 and wire 46 rest on the fingers 66, 68, 70, 72, and 74.

In order to hold the wires firmly in position as they are being soldered to the pads at the spacing determined by the spacing means fingers 66, 68, 70, 72, and 74, something is needed to positively press the wire against the spacing means fingers. A pressing means 92 was developed and is used for this purpose and comprises a pressing means mounting member 94 similar to the spacing means mounting member 52. The pressing means mounting member 94 has several pressing fingers 96, 98, 100, and 102 in the form of rigid metal rods each being held perpendicular to a rectangular surface 104 of the pressing means mounting member 94 by set screws 106, 108, 110, 112, and 114. The set screws contact respective rods which are inserted into individual holes in the surface 104 of member 94.

The pressing means mounting member 94 is pivotally attached to the holding means 50 by a longitudinally faced pivot rod 116 inserted through holes in raised corner portions of the holding means 50 and a corresponding hole extending longitudinally in the pressing means mounting member 94. The pivot rod 116 is held in place in the member 94 by a set screw 118. Pressure is exerted by fingers 96, 98, 100, and 102 by engaging the ends of set screws 120 and 122 with a flat surface of pivot rod 116 through the corresponding tapped holes in holding means 50.

The spacing means mounting member 52 and the pressing means mounting member 94 pivot on parallel rods 76 and 116, respectively. The rods 76 and 116 are located in a plane parallel to the recess 48 and substrate 26.

The length of the wire above the substrate is selected and determined by the sum of widths of the pads and the sums of the widths of the spacings there between. The length must thus be selected to be greater than the sum of the pad widths and spacing widths which are to lie underneath the wire.

What is claimed is:

1. A fixture for placement of a preselected length of wire uniformly above a film on a microcircuit substrate comprising:

holding means for holding a substrate;

spacing means for spacing preselected points within the preselected length of a wire a predetermined distance above a film comprising a spacing means mounting member and a spacing means finger, the finger being attached to the spacing means mounting member, the spacing means being connected to the holding means by a first pivot rod extending through the spacing means and the holding means, the spacing means mounting member being pivotally attached to the holding means by said first rod, and the spacing means finger being demountably attached to the spacing means mounting member;

pressing means for pressing a wire against the spacing means, the pressing means being connected to the holding means by a second pivot rod extending through the pressing means and the holding means, the pressing means comprising a pressing means mounting member and at least one pressing finger, a pressing finger being located above each spacing means finger, each pressing finger being connected to the pressing means mounting member, the pressing means mounting member being pivotally attached to the holding means, the pressing means mounting member being opposite the spacing means mounting member, each spacing means finger adapted for placement above a film between a wire and a substrate, a pressing finger being spaced above each said spacing means finger the spacing means mounting member and the pressing means mounting member pivoting on parallel rods, the rods adapted to be located in a plane parallel to a substrate, the spacing means mounting member and the pressing means mounting member each being elongated along their respective axes, each mounting member having an axial hole therein, each mounting member having a pivot rod in the respective axial hole, each mounting member having a cylindrical surface uniformly spaced about the respective pivot axes and located proximate to the holding means, said holding means comprising a base member having a recesses space therein adapted for receiving a substrate, the recessed space being located between the mounting members, the base member further comprising means for receiving the respective pivot rods and a wire receiving means adapted for receiving a wire.

2. A fixture according to claim 1, wherein each wire receiving means is a pair of troughs, located on opposite ends of the base inbetween the mounting means, the troughs being located in a raised portion of the base.

3. A fixture according to claim 2, wherein the predetermined distance is the thickness of the spacing means fingers when measured along a line orthogonal to a surface of the substrate, the spacing means fingers being parallel to the surface of the substrate.

* * * * *

UNITED STATES PATENT OFFICE
CERTIFICATE OF CORRECTION

PATENT NO. : 3,972,463
DATED : August 3, 1976
INVENTOR(S) : E.S. Conlon et al

It is certified that error appears in the above-identified patent and that said Letters Patent are hereby corrected as shown below:

In Col. 1 after the title insert:

-- The invention herein disclosed was made in the course of or under a contract or subcontract thereunder with the Department of the Navy.--

Signed and Sealed this

Third Day of May 1977

[SEAL]

*Attest:*

RUTH C. MASON
*Attesting Officer*

C. MARSHALL DANN
*Commissioner of Patents and Trademarks*